United States Patent [19]

Mostafazadeh et al.

[11] Patent Number: 5,783,870
[45] Date of Patent: Jul. 21, 1998

[54] METHOD FOR CONNECTING PACKAGES OF A STACKED BALL GRID ARRAY STRUCTURE

[75] Inventors: Shahram Mostafazadeh, Santa Clara; Joseph O. Smith, Morgan Hill, both of Calif.

[73] Assignee: National Semiconductor Corporation, Santa Clara, Calif.

[21] Appl. No.: 557,264

[22] Filed: Nov. 14, 1995

Related U.S. Application Data

[63] Continuation-in-part of Ser. No. 405,486, Mar. 16, 1995, abandoned.

[51] Int. Cl.[6] .................................................. H01L 25/00
[52] U.S. Cl. ........................... 257/791; 257/686; 257/777; 257/778; 361/733; 361/735; 361/744; 361/764; 361/784; 361/803
[58] Field of Search ................................. 257/686, 777, 257/778, 791; 361/733, 735, 743, 744, 761, 763, 764, 784, 803

[56] References Cited

U.S. PATENT DOCUMENTS

| | | | |
|---|---|---|---|
| 4,942,454 | 7/1990 | Mori et al. | 357/70 |
| 5,060,844 | 10/1991 | Behun et al. | 228/215 |
| 5,172,303 | 12/1992 | Bernardoni et al. | 361/396 |
| 5,222,014 | 6/1993 | Lin | 361/414 |
| 5,241,456 | 8/1993 | Marcinkiewicz et al. | 361/792 |
| 5,376,825 | 12/1994 | Tukamoto et al. | 257/685 |
| 5,399,898 | 3/1995 | Rostoker | 257/499 |
| 5,454,160 | 10/1995 | Nickel | 29/840 |

FOREIGN PATENT DOCUMENTS

| | | | |
|---|---|---|---|
| 1-53440 | 3/1989 | Japan. | |
| 403295266 | 12/1991 | Japan | 257/723 |
| 5-335633 | 12/1993 | Japan. | |

*Primary Examiner*—Leo P. Picard
*Assistant Examiner*—David Foster
*Attorney, Agent, or Firm*—Skjerven, Morrill, MacPherson, Franklin & Friel; Edward C. Kwok

[57] ABSTRACT

Stackable ball grid array packages are disclosed, wherein a plurality of separate ball grid array packages may be stacked, one on top of another, and interconnected by conductive terminals located on opposite surfaces of each of the ball grid array packages. Thus, the mounting of ball grid array packages on a printed circuit board may be conducted in three dimensions rather than two dimensions, requiring considerably less printed circuit board surface area and reducing parasitic inductances and capacitances between the terminals of the stacked ball grid array packages. An air gap is formed between adjacent, stacked packages for cooling. Connections between adjacent packages are made by conductive epoxy and noble metal balls.

15 Claims, 6 Drawing Sheets

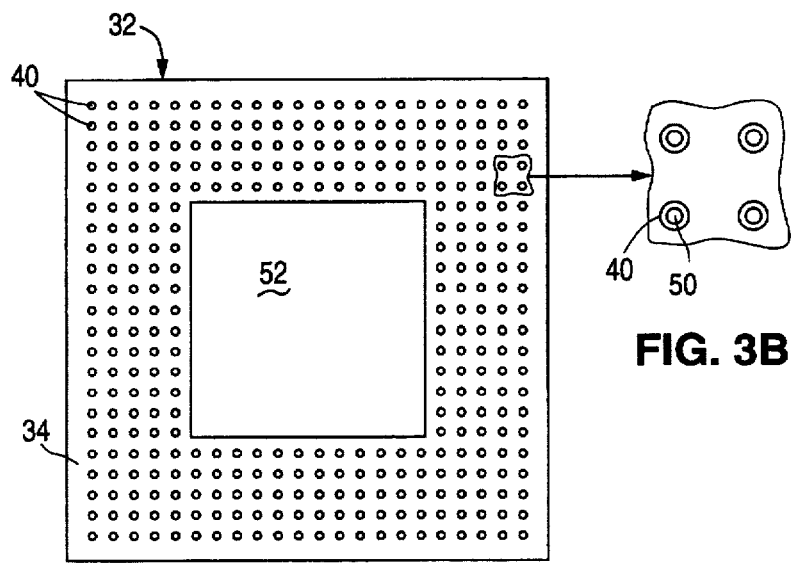
FIG. 3A
FIG. 3B
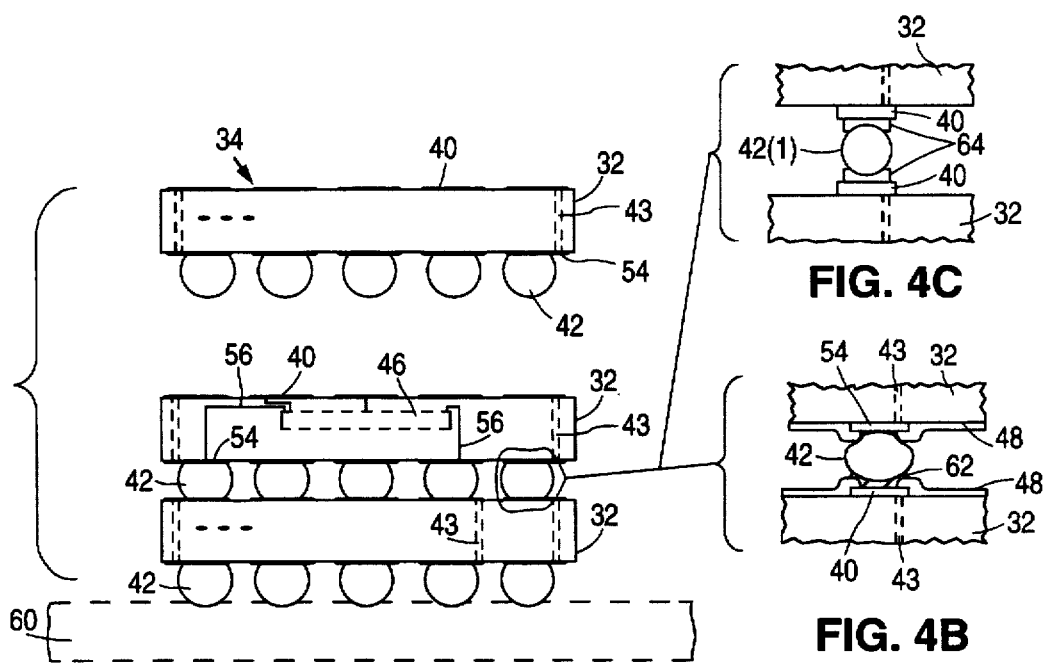
FIG. 4A
FIG. 4B
FIG. 4C

METHOD FOR CONNECTING PACKAGES OF A STACKED BALL GRID ARRAY STRUCTURE

CROSS-REFERENCES TO RELATED APPLICATIONS

The present application is a continuation-in-part of U.S. patent application Ser. No. 08/405,486, filed Mar. 16, 1995 now abandoned.

FIELD OF THE INVENTION

This invention relates to integrated circuit packages and in particular to ball grid array packages for mounting on a printed circuit board.

BACKGROUND OF THE INVENTION

A very area-efficient type of surface mounted package which is increasing in popularity is a ball grid array package, illustrated in FIG. 1. In FIG. 1, a ball grid array package 10 contains a silicon die having its terminals electrically connected to respective solder balls 12 distributed on a bottom surface of the package 10. A printed circuit board 14 has formed on its surface a corresponding array of conductive pads 16 which align with the array of solder balls 12. Conductive traces (not shown) on the printed circuit board 14 lead from each of the pads 16 to other circuitry on the board 14. To mount the package 10 to the board 14, the package 10 is positioned on the pads 16, and the resulting structure is heated until the solder balls 12 melt and fuse to the conductive pads 16. A solder paste may be first applied to pads 16 to ensure electrical contact between balls 12 and pads 16.

FIG. 2 shows the bottom surface of one type of ball grid array package 10, with a portion of the package 10 cut away to show the internal structure of the package 10. Solder balls 12, fused to conductive pads, are distributed around the periphery of the package 10, although the balls 12 may also be distributed uniformly across the entire bottom surface of the package 10. A silicon die 18 has wires 20 extending from terminals (bonding pads) 22 to respective traces formed on one or more insulating layers 24. A die may also be a flip chip whose terminals directly contact conductors in the package. Conductive vias 26 provide an electrical connection between the solder balls 12 and their respective traces formed on the insulating layers 24. In a simpler package, the terminals of a silicon die may be connected to a single layer of conductive traces which lead to the solder balls, thus obviating the need for multi-layer vias. A metal heat sink 28 may be provided on the top surface of the ball grid array package 10 to conduct heat away from the die 18.

The surface area of the printed circuit board 14 in FIG. 1 must be at least as large as the combined bottom surface areas of the packages to be mounted to the printed circuit board 14. This presents a problem for many applications where it is desirable to minimize the size of the printed circuit board so that it may fit in a small space.

Further, the traces on a printed circuit board, connecting the terminals of one package to another package, generate parasitic inductances and capacitances which distort and delay signals, thus degrading the performance of the system.

What is needed is a way to increase the density of circuits on a printed circuit board to both reduce the required size of the printed circuit board and reduce the parasitic inductances and capacitances resulting from the interconnecting traces on the printed circuit board.

SUMMARY OF THE INVENTION

Stackable ball grid array packages are disclosed, wherein a plurality of separate ball grid array packages may be stacked, one on top of another, and interconnected by contact pads located on opposite surfaces of the ball grid array packages. Thus, the mounting of ball grid array packages on a printed circuit board may be conducted in three dimensions rather than two dimensions, requiring considerably less printed circuit board surface area. This inherently results in the elimination of printed circuit board traces interconnecting the various packages, thus resulting in lower parasitic inductances and capacitances between the terminals of the stacked ball grid array packages.

Such a stack of packages may substitute for a multi-chip integrated circuit package while using up the same or less printed circuit board area. The stack would be easier to test and have higher yields than the multi-chip package, since each of the ball grid array packages in the stack may be tested and verified individually before being used in the stack.

The stacked ball grid array packages may also be formed to have an air gap between adjacent packages, thus making cooling of the individual packages possible.

In accordance with a first embodiment of the present invention, adjacent packages of the stacked ball grid array are interconnected using solder balls, with the solder balls within the stack having a higher melting temperature than the bottom solder balls (that is, the solder balls connected between the bottom package and the printed circuit board).

In a second embodiment of the present invention, adjacent packages of the stacked ball grid array are interconnected using balls having a noble metal outer surface attached to the packages by conductive epoxy. In one variation of the second embodiment, solder balls are used to connect the bottom package to the printed circuit board. In another variation, the bottom package is attached to the printed circuit board using conductive epoxy and noble metal balls. The conductive epoxy is applied to interconnect pads of the packages, and the noble metal balls are mounted between the epoxy applied to the interconnect pads of adjacent packages. The use of noble metal prevents the oxidation of the interconnect balls, thereby providing a reliable low-resistance interconnect. Common solder balls form an oxide on their surface which reduces conductivity.

In accordance with a third embodiment of the present invention, a method is provided for constructing a stacked ball grid array by applying a conductive epoxy to bonding pads of the packages, and mounting balls having a noble metal surface between the epoxy of the adjacent packages. The epoxy is then cured using known methods. The stacked ball grid array is then mounted onto a host printed circuit board using known solder ball/column methods, or using conductive epoxy and noble metal balls.

BRIEF DESCRIPTION OF THE DRAWINGS

FIG. 3A is a plan view of the top surface of a ball grid array package in accordance with one embodiment of the present invention.

FIG. 3B is a magnified view of the contact pads on the top surface of the ball grid array package shown in FIG. 3A.

FIG. 4A is a side view of ball grid array packages being stacked on top of one another on a printed circuit board in accordance with this invention.

FIG. 4B is a magnified side view of a portion of the structure of FIG. 4A in accordance with a first embodiment of the present invention.

FIG. 4C is a magnified side view of a portion of the structure of FIG. 4A in accordance with a second embodiment of the present invention.

DETAILED DESCRIPTION OF THE PREFERRED EMBODIMENTS

Figure 2:
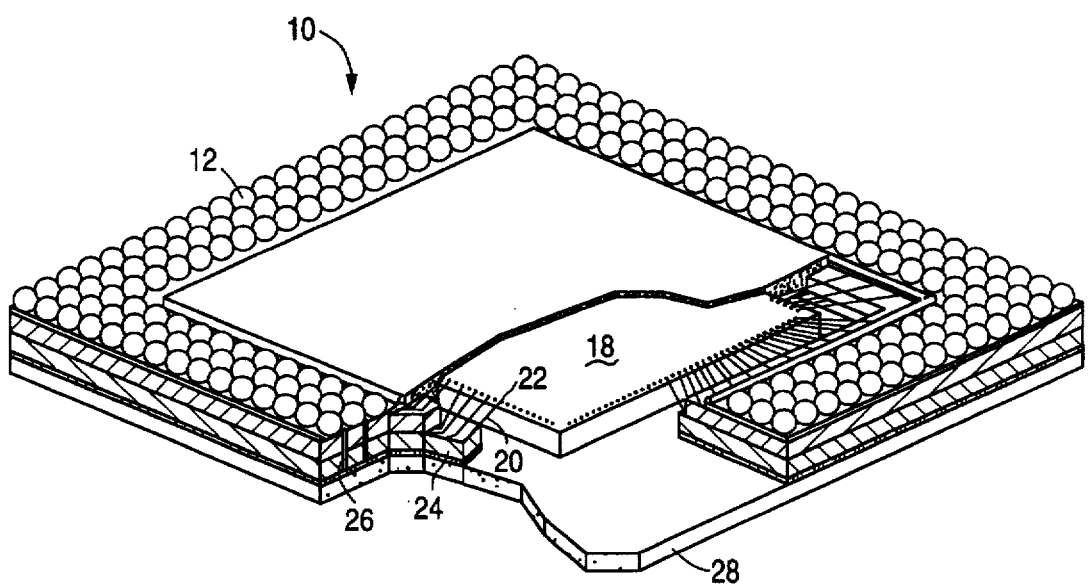
FIG. 2 is a perspective view, with a cut-away portion, of the bottom surface of a prior art ball grid array package.

In FIGS. 3A through 6, a ball grid array package 32 in accordance with a first embodiment of the present invention includes an array of solder balls 42 (FIG. 4A) on the bottom surface of the package 32 (similar to FIG. 2) and an array of conductive contact pads 40 (FIGS. 3A–4A) on the top surface 34 of the ball grid array package 32. Selected ones of the contact pads 40 are connected directly to the solder balls 42 on the opposite surface of the package 32 using conductive vias 43 (FIG. 4A), and selected ones of the contact pads 40 are connected to terminals of the integrated circuit die 46 (FIG. 4A) housed in the ball grid array package 32.

Although FIG. 3A shows contact pads 40 around the periphery of the top surface 34, the contact pads 40 may be formed in any arrangement. There is no direct correlation between the number of solder balls 42 on the bottom surface and the number of pads 40 on the top surface 34, since these numbers will depend on the requirements of the package when used in a stack.

FIG. 3B is magnified portion of the top surface 34 of the package 32 shown in FIG. 3A. When solder balls 42 are used to provide connections between adjacent packages of the stack, contact pads 40 may be formed of copper, aluminum, gold, or an alloy which has been sputtered, plated, or otherwise deposited on the top surface 34 of the package 32 and etched using a conventional photolithographic process. Any suitable process and noble metal may be used.

In accordance with one aspect of the first embodiment, to effectively increase the separation between contact pads 40 and to more precisely define the contact area, a heat-resistant polymer solder mask 48 (FIG. 4B) is deposited over the top surface 34 of package 32 leaving a central portion 50 (FIG. 3B) of the contact pad 40 exposed. The exposed central portion 50 may have a diameter on the order of 25 mils. Such solder masks are frequently used on ball grid array packages to precisely align the solder balls with respect to one another and limit their spreading.

A heat sink for the integrated circuit die within package 32 may form the middle portion 52 of the top surface 34 in FIG. 3A.

FIG. 4A is a simplified side view of a number of packages 32 showing solder balls 42, contact pads 40 located on the top surface 34 of the packages 32, and solder pads 54 located on the bottom surface of the packages 32 to which are attached respective solder balls 42. Solder pads 54 may be similar to those conventionally used in ball grid array packages to electrically contact a solder ball. Solder pads 54 may be copper or another conductive metal. The manner of forming solder pads 54 may be identical to that used to form contact pads 40.

An integrated circuit die 46 is also illustrated within package 32, where terminals of die 46 are connected, using wires, traces, and vias, to pads 40 and 54. Die 46 may also be a flip chip whose terminals may directly contact conductors leading to pads 40 and 54, thus obviating the need for wires. A single package 32 may also include multiple dies. The connections (shown as conductors 56) will depend upon the particular requirements for die 46 to operate in conjunction with the circuits above it and below it in the stack.

In the event that a bottom solder pad 54 is to be connected to a top contact pad 40, a conductive via 43 is formed extending through package 32. Such a via 43 may be formed by forming a hole through the insulating layers in package 32 by either drilling, using a laser, using photolithography, or using a mold, and then filling or coating the hole with a conductive material such as by using a plating process, a dipping process, or other deposition process. Forming vias is a well known process, and those skilled in the art will readily understand the variety of ways in which vias may be formed.

Figure 5:
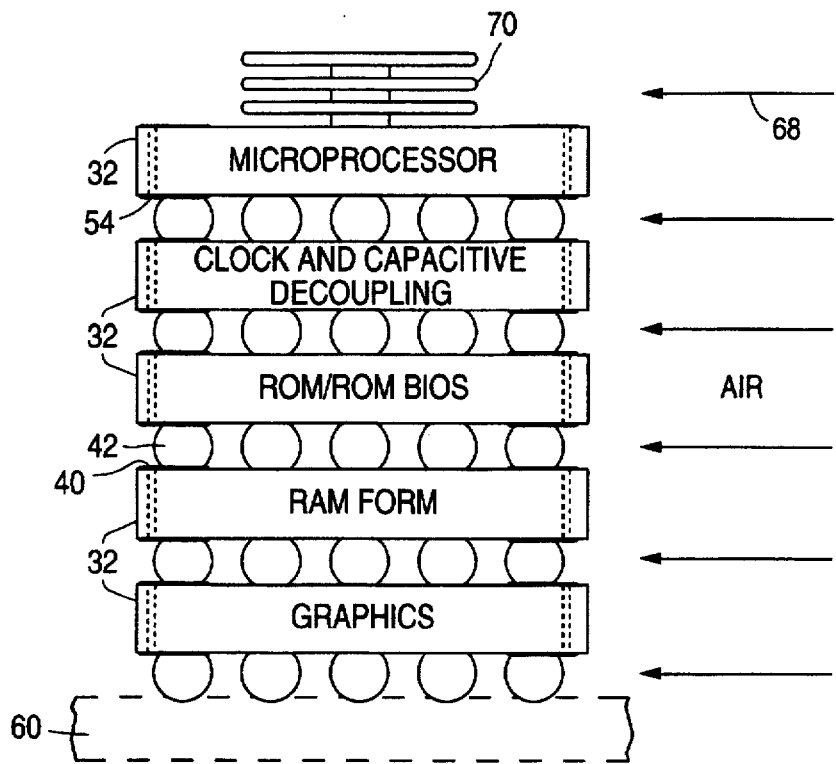
FIG. 5 is a side view of stacked ball grid array packages having specified functions and the manner of cooling the individual packages in accordance with one embodiment of the invention.

Each die 46 (or multiple dies) within its respective package 32 in the stack shown in FIG. 4A may perform a different function, as illustrated in FIG. 5, or the packages 32 in the stack may perform the same function in parallel, such as would be the case for a stack of RAMs operating as one large RAM unit.

Figure 1:
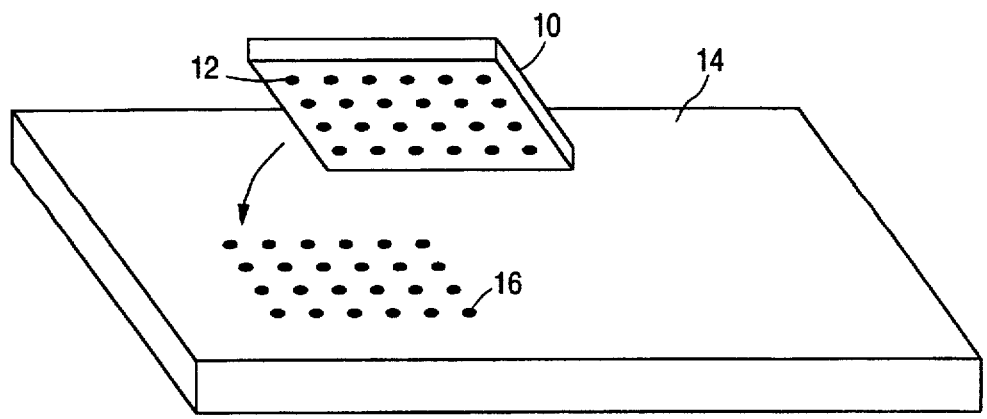
FIG. 1 is a perspective view of a prior art printed circuit board and ball grid array package.

FIG. 4A also shows a conventional printed circuit board 60 on which the bottom package 32 is mounted in a conventional manner. Such a printed circuit board 60 may be similar to that shown in FIG. 1 as printed circuit board 14. The individual packages 32 may be obtained separately from the manufacturer and stacked by the customer, or the packages 32 may be purchased as a preconnected module from the manufacturer, where the customer then fuses the solder balls 42 on the bottom package 32 to their respective pads on the customer's printed circuit board 60.

FIG. 4B is a magnified view of a single interconnection between two ball grid array packages 32 in accordance with the first embodiment of the present invention. When the packages 32 are initially manufactured, an automated machine deposits a solder ball 42 on a respective solder pad 54 on the bottom surface of a package 32. A solder mask 48, previously described, exposes a central portion of the solder pad 54 to which is adhered the solder ball 42. A contact pad 40 on the top surface of another package 32 is electrically connected to solder ball 42 via a solder paste 62 which has been previously deposited on the contact pad 40. When the upper package 32 is then placed on top of the lower package 32, the solder paste 62 ensures electrical contact between solder ball 42 and contact pad 40. Once the packages 32 are properly positioned with respect to one another, the structure is heated to a sufficient temperature to melt the paste 62, and optionally melt the solder ball 42, so that the metals merge, creating a reliable electrical contact. This temperature is typically on the order of 183° C. As seen, the solder ball 42 is slightly compressed due to a slight downward pressure from the weight of the packages 32 when solder ball 42 is in a molten (or semi-molten) state.

In accordance with the first embodiment, the solder ball 42 has a melting temperature in excess of 200° C. and the paste 62 has a melting temperature of about 183° C. At a temperature above 183° C. but below 200° C. the heated paste 62, containing flux, removes any oxide barrier between the solder ball 42 and the paste 62. The melted paste 62 adheres to solder ball 42 without melting the central portion of the solder ball 42. Thus, using this method, solder ball 42 generally retains its spherical shape.

If a preconnected module is provided by the manufacturer, it is desirable that the solder ball connections within the module (that is, between the packages 32) are not melted or reflowed when the user reflows the bottom solder balls 42 when a customer attaches the module to a printed circuit board. To avoid reflow of the solder ball connections, in accordance with another aspect of the first embodiment, the solder balls 42/paste 62 positioned between adjacent packages 32 have a higher melting temperature than the solder balls 42/paste 62 connected between the bottom package 32 and the printed circuit board. This allows mounting by the customer to take place at a temperature between the melting temperatures of the bottom solder balls/paste and the solder balls/paste within the module.

FIG. 4C is a magnified view of a single interconnection between two ball grid array packages 32 in accordance with a second embodiment of the present invention. In the second embodiment, balls 42(1) are mounted using conductive epoxy 64 between contact pads 40 of the upper package 32 and the lower package 32. Each ball 42(1) preferably has a noble metal outer surface, and is made from a material having a higher melting temperature than the solder balls connected to a lower surface of the bottom package of the module. It is only necessary that the outer surface of the balls 42(1) be coated with a noble metal. For example, a copper ball coated with gold or silver may be used. In addition, a solder material having a relatively high melting point and coated with a noble metal may be used.

In accordance with one aspect of the second embodiment, solder balls are used to connect the bottom package to a printed circuit board. This allows a customer to purchase a module and mount the module to a printed circuit board using common reflow soldering, while connections between the packages within the module remain reliably connected.

In accordance with another aspect of the second embodiment, balls 42(1) and conductive epoxy may be used to connect the bottom package to a printed circuit board.

FIG. 5 illustrates a stack of connected ball grid array packages 32 which may be used in a computer having a display. The stack may be sold as a module which is ultimately connected to a printed circuit board 60 through the solder ball connections on the bottom package 32. The five stacked packages 32 may contain one or more integrated circuits with the functions of microprocessor, clock and capacitive decoupling, ROM or ROM BIOS, RAM, and graphics, respectively. In this particular embodiment, various ones of the solder ball/contact pad 40 connections form part of a common bus that runs through all five packages 32. Other common connections through the five packages 32 may include power, ground, and clock.

An air flow, as shown by arrows 68, may pass through an air gap between adjacent stacked packages 32. Since the microprocessor (the top package 32) may need additional heat removal, an additional heat sink 70 is provided.

Any one of the stack packages 32 may also function as a connection interface between an upper and lower package 32, where the interface would provide interconnections, which may be programmable or fixed, between its top surface contact pads 40 and bottom surface solder balls 42. Such an interface package may be useful when stacking a conventional or nonstandardized ball grid array package on top of a ball grid array package in accordance with the present invention. For example, the top microprocessor package in FIG. 5 may instead be conventional since no packages are to be stacked on top of it. An interface connector package may be needed to interface the microprocessor package with one of the underlying standardized packages 32.

A bottom package of the stack need not be a ball grid array package but can include any conventional terminal configuration for connection to the printed circuit board 60.

Figure 6:
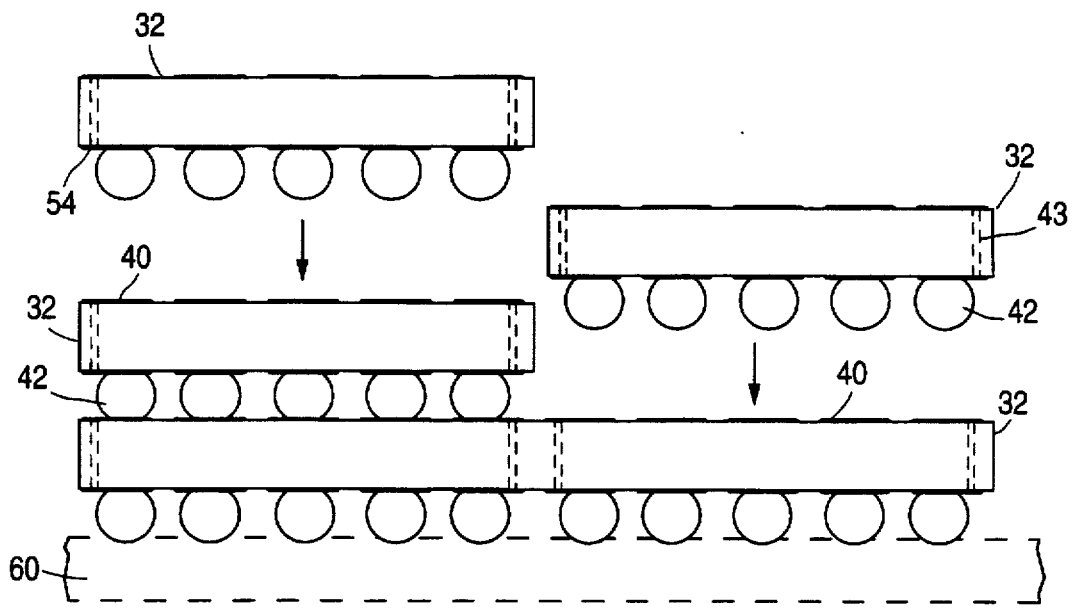
FIG. 6 illustrates another embodiment of the invention where one ball grid array package has mounted on it a plurality of other ball grid array packages.

FIG. 6 illustrates another embodiment of the invention where the bottom ball grid array package 32 has mounted on it two or more ball grid array packages 32. The bottom package 32 may be a microprocessor, an interface or any other device. The bottom package 32 may also be used in the middle of a stack.

FIG. 7A through 7H illustrate a method for producing a stacked ball array in accordance with a third embodiment of the present invention.

Figure 7A:
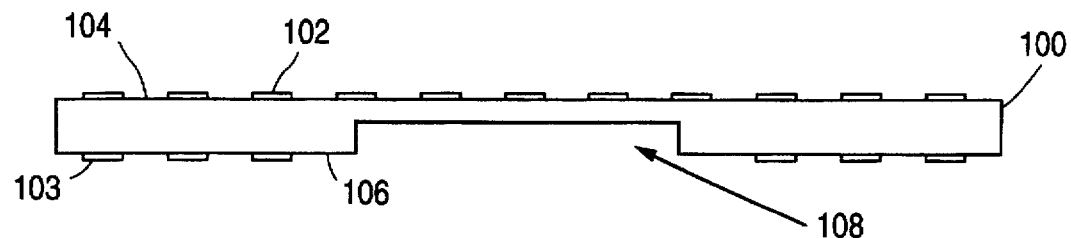
FIGS. 7A–7H are side views showing method steps for constructing a stacked ball grid array in accordance with the present invention.

Referring to FIG. 7A, a package substrate 100 includes upper bonding pads 102 formed on an upper surface 104, and lower bonding pads 103 formed on a lower surface 106. Electrical connections between selected upper bonding pads 102 and lower bonding pads 103, and between bonding pads 102, 103 and inner leads of the substrate 100, are provided using known techniques. Upper bonding pads 102 and lower bonding pads 103 are preferably coated with a non-oxidizing material, preferably a noble metal. The substrate 100 may be either plastic or ceramic, and may include a cavity 108 formed on the lower surface 106 for receiving a die.

Figure 7B:
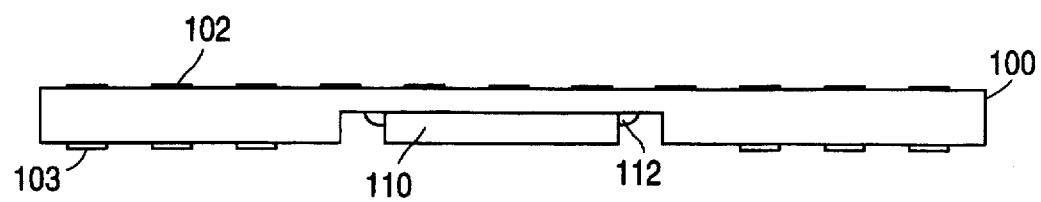
Figure 7C:
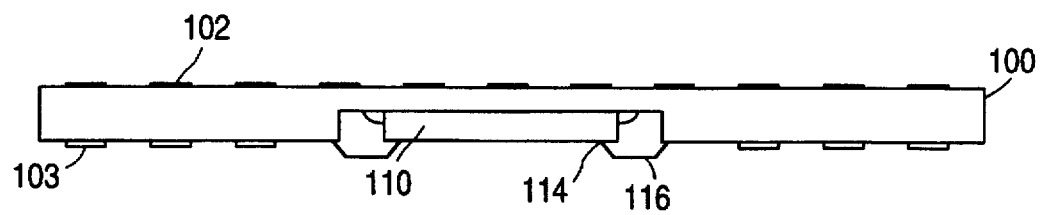
Figure 7D:
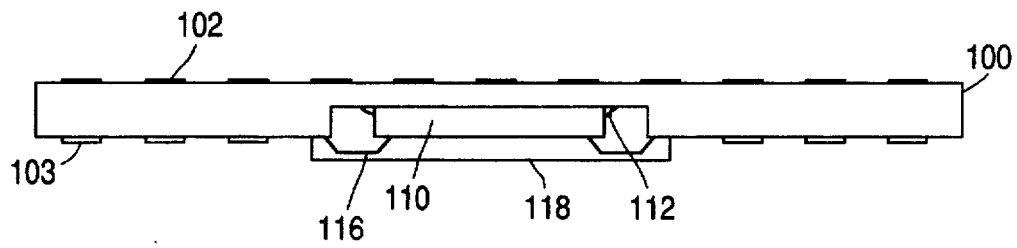

As shown in FIG. 7B, a die 110 is mounted in the cavity 108 by die attach material 112 using known methods. As depicted in FIG. 7C, die bonding pads 114 of die 110 are then electrically connected to selected lower bonding pads 102 and upper bonding pads 103 by wires 116 using known wirebonding methods. Alternatively, the die 110 may be bonded using tape automated bonding (TAB) or flip chip bonding technologies. Next, as depicted in FIG. 7D, an encapsulation material 118 is formed over the die 110 and wires 116 for protection. Either a plastic encapsulant material or a cap made of ceramic, plastic or metal may be used for the encapsulant material.

Figure 7E:
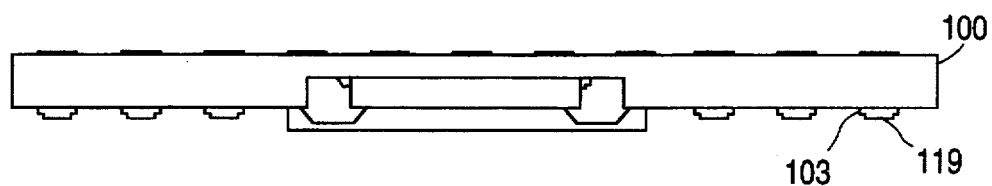

Referring to FIG. 7E, conductive epoxy 119, such as Ablestik 965-1L or its equivalent, is next applied to lower bonding pads 103 using screen printing, dispensing or any other method that is known in the art.

Figure 7F:
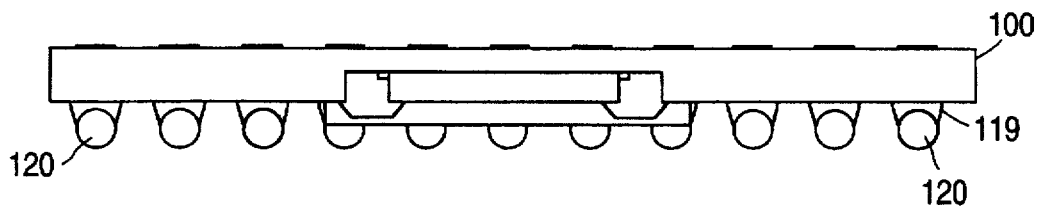

Referring to FIG. 7F, noble metal balls 120 are attached to the lower bonding pads 103 and held by the epoxy 119. As mentioned above, the noble metal balls 120 may be solid, or may be a relatively high melting temperature material, such as copper, which is coated with a noble metal. Once the noble metal balls 120 are attached to the epoxy 119, the epoxy 119 is cured using known methods.

Figure 7G:
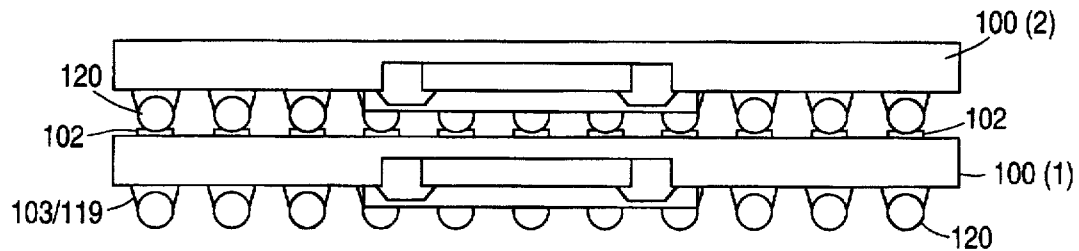

FIG. 7G shows the connection between a first substrate 100(1) and a second substrate 100(2). Both the first substrate 100(1) and the second substrate 100(2) are prepared as described above, and conductive epoxy is applied on upper bonding pads 102 of a first substrate 100(1). The second substrate 100(2) is then aligned over first substrate 100(1), and the balls 120 are contacted with the epoxy 119 applied to the upper bonding pads 102 of the first substrate 100(1).

Figure 7H:
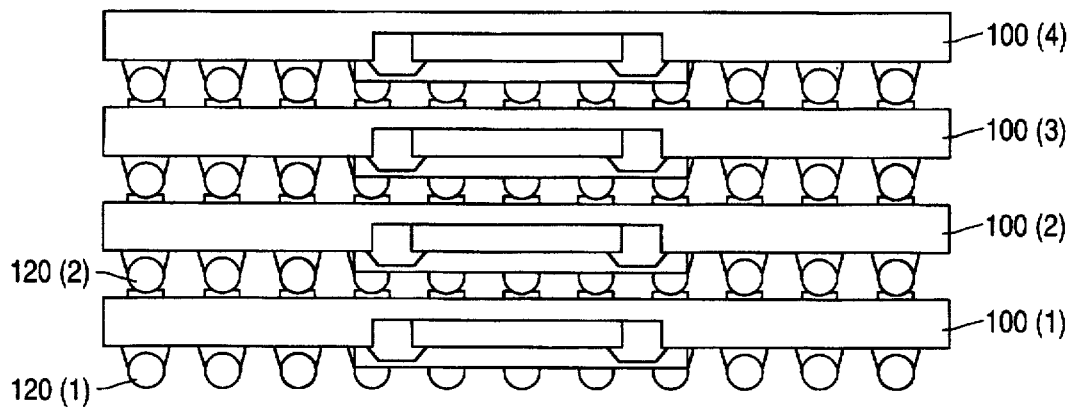

FIG. 7H shows a module including four stacked packages 100(1) through 100(4) which are joined using the above-described method. It is noted that the epoxy joining two of the substrates, for example, the epoxy joining balls 120(2) between the substrate 100(1) and the substrate 100(2), may be cured prior to mounting of substrates 100(3) and 100(4).

Alternatively, substrates 100(1) through 100(4) may be stacked prior to curing. In addition, substrate 100(4) may be a conventional ball grid array package (that is, excluding bonding pads on its upper surface).

Subsequent to the formation of the four-substrate ball grid array module shown in FIG. 7H, the module may be assembled onto a printed circuit board by a customer. Should the customer wish to attach the module using known solder methods, the balls 120(1) attached to the lower surface 106 of lower-most substrate 100(1) may be typical solder balls. When the customer heats the solder balls 120(1) noble metal balls 120(2) through 120(4) are not melted, thereby preventing undesired reflow during mounting.

Conversely, the customer may wish to attach the stacked ball grid module shown in FIG. 7H using the epoxy methods described herein. In this instance, noble metal balls 120(1) are mounted as described above, and the printed circuit board (not shown) is provided with an epoxy pattern matching the pattern of noble metal balls 120(1), and curing is performed after the module is mounted onto the printed circuit board.

The resulting stacked packages greatly reduce the required surface area of a printed circuit board and inherently eliminate the parasitic inductances and capacitances generated by circuit board traces previously required for interconnecting surface mounted packages. Also, testing of a system to be formed by a stack of packages is made simpler since each package may be verified separately before being connected within a stack. This is an improvement over the testing of multi-chip packages, which must be tested as a complete system. Yield is also increased since the failure of one package to be stacked does not affect the yield of the other packages to be used in the system.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An electrical structure comprising:

a first package having first pads located on a bottom surface of the first package and second pads located on an opposite, top surface of the first package, the first package housing one or more integrated circuits electrically connected to selected ones of the first and second pads, wherein one of the first pads is electrically connected to one of the second pads;

a second package physically mounted over the top surface of the first package, the second package having third conductive pads located on a bottom surface, the second package including one or more integrated circuits electrically connected to selected ones of the third pads;

a first conductive ball forming an electrical connection between one of the second pads and one of the third pads; and a second conductive ball connected to one of the first pads of the first package;

wherein the first conductive ball is attached to said one of the second pads and to said one of the third pads by conductive epoxy, wherein an outer surface of the first conductive ball comprises a first material having a first melting temperature, wherein the second conductive ball comprises a second material having a second melting temperature, and wherein the first melting temperature is higher than the second melting temperature.

2. The structure of claim 1 wherein an outer surface of the first conductive ball comprises a noble metal.

3. The structure of claim 2 wherein the first conductive ball includes a central core comprising copper and the noble metal is gold.

4. The structure of claim 1, wherein fourth pads are also located on a top surface of the second package, and the structure further comprises:

a third package having a plurality of fifth pads located on a bottom surface of the third package, wherein the third package is physically mounted overlying the top surface of the second package, and wherein the fourth pads located on the top surface of the second package are aligned with and electrically connected to respective ones of the fifth pads on the bottom surface of the third package by third conductive balls held by conductive epoxy, wherein outer surfaces of the third conductive balls comprise the first material having the first melting temperature.

5. The structure of claim 4 wherein the first package, the second package, and the third package are ball grid array packages.

6. The structure of claim 1 wherein the second conductive balls are solder balls.

7. A method for electrically interconnecting integrated circuit packages comprising the steps of:

providing a first package having first pads located on a bottom surface of the first package, and having second pads located on an opposite, top surface of the first package, the first package housing one or more integrated circuits having terminals connected to selected ones of the first and second pads;

applying a conductive epoxy to the second pads;

providing a second package having first conductive balls adhered to third pads located on at least a bottom surface of the second package, wherein the first conductive balls connected between the first package and the printed circuit board include an outer surface comprising a first material having a first melting temperature;

positioning the second package over the top surface of the first package so that the first conductive balls are aligned with and contact the conductive epoxy applied to the second pads of the first package;

curing the conductive epoxy so as to adhere the first conductive balls to the second pads located on the top surface of the first package and thereby electrically connect electrical elements within the second package to electrical elements within the first package; and mounting the first and second packages onto a printed circuit board such that second conductive balls are located between contacts formed on the printed circuit board and the first pads formed on the first package, wherein an outer surface of the second conductive balls comprise a second material having a second melting temperature, and wherein the first melting temperature is higher than the second melting temperature, and heating the second conductive balls to a temperature which is between the second melting temperature and the first melting temperature such that the second conductive balls are melted to provide electrical connections between contacts formed on the printed circuit board and the first and second packages.

8. The method of claim 7, wherein the second package includes fourth pads located on a top surface of the second package, the method further comprising the steps of:

providing a third package having fifth pads located on a bottom surface of the third package, and having third conductive balls adhered to fifth pads, wherein outer surfaces of the third conductive balls comprise the first material having the first melting temperature;

applying a conductive epoxy to the fourth pads of the second package; and positioning the third package over the top surface of the second package so that the third conductive balls are aligned with and contact the conductive epoxy applied to the fourth pads of the second package;

wherein the step of curing occurs after the step of positioning the third package.

9. The method of claim 7, wherein the second package includes fourth pads located on a top surface of the second package, the method further comprising the steps of:

providing a third package having fifth pads located on a bottom surface of the third package, and having third conductive balls adhered to fifth pads, wherein outer surfaces of the third conductive balls comprise the first material having the first melting temperature;

applying a conductive epoxy to the fourth pads of the second package; and positioning the third package over the top surface of the second package so that the third conductive balls are aligned with and contact the conductive epoxy applied to the fourth pads of the second package;

wherein the step of positioning the third package occurs after the step of curing.

10. The method of claim 7, wherein the conductive balls connected between the first package and the printed circuit board are solder balls.

11. An electrical structure comprising:

a first package having first pads located on a bottom surface of the first package and second pads located on an opposite, top surface of the first package, the first package housing one or more integrated circuits electrically connected to selected ones of the first and second pads, wherein one of the first pads is electrically connected to one of the second pads;

a second package physically mounted over the top surface of the first package, the second package having third conductive pads located on a bottom surface, the second package including one or more integrated circuits electrically connected to selected ones of the third pads;

a first conductive ball attached to one of the second pads and to one of the third pads by a first conductive epoxy having a first melting temperature, a second conductive ball attached to one of said first pads by a second conductive epoxy having a second melting temperature, and wherein the first melting temperature is higher than the second melting temperature.

12. The structure of claim 11 wherein the first and second conductive balls include an outer surface comprising a noble metal.

13. The structure of claim 12 wherein the first conductive ball includes a central core comprising copper and the noble metal is gold.

14. The structure of claim 11, wherein fourth pads are also located on a top surface of the second package, and the structure further comprises:

a third package having a plurality of fifth pads located on a bottom surface of the third package, wherein the third package is physically mounted overlying the top surface of the second package, and wherein the fourth pads located on the top surface of the second package are aligned with and electrically connected to respective ones of the fifth pads on the bottom surface of the third package by third conductive balls held by a third conductive epoxy having the first melting temperature.

15. The structure of claim 14 wherein the first package, the second package, and the third package are ball grid array packages.

* * * * *